US008703651B2

(12) United States Patent  
Harshman et al.

(10) Patent No.: US 8,703,651 B2
(45) Date of Patent: Apr. 22, 2014

(54) LAYERED IONIC SUPERCONDUCTOR

(76) Inventors: Dale Richard Harshman, Lynden, WA (US); Anthony Thomas Fiory, Summit, NJ (US)

( * ) Notice: Subject to any disclaimer, the term of this patent is extended or adjusted under 35 U.S.C. 154(b) by 19 days.

(21) Appl. No.: 13/543,655

(22) Filed: Jul. 6, 2012

(65) Prior Publication Data

US 2014/0011683 A1    Jan. 9, 2014

(51) Int. Cl.
*H01L 39/12* (2006.01)
*H01L 39/24* (2006.01)
*C04B 35/45* (2006.01)
*C04B 35/453* (2006.01)

(52) U.S. Cl.
USPC ........... 505/123; 505/461; 505/121; 505/125; 505/470; 428/696

(58) Field of Classification Search
CPC ............................... H01L 39/12; H01L 39/24
USPC ......... 505/110, 120, 121, 123, 461, 470, 100, 505/150, 472; 427/62; 423/464; 252/500, 252/519.2; 428/696
See application file for complete search history.

(56) References Cited

U.S. PATENT DOCUMENTS

| 3,932,315 | A |   | 1/1976  | Sleight          |         |
|-----------|---|---|---------|------------------|---------|
| 4,916,116 | A |   | 4/1990  | Yamazaki         |         |
| 5,004,725 | A |   | 4/1991  | Ovshinsky et al. |         |
| 5,063,202 | A |   | 11/1991 | Narayan          |         |
| 5,081,103 | A |   | 1/1992  | Gressler et al.  |         |
| 5,132,281 | A |   | 7/1992  | Chevallier et al.|         |
| 5,183,799 | A | * | 2/1993  | Ogushi et al.    | 505/110 |
| 5,196,396 | A |   | 3/1993  | Liber            |         |
| 5,198,414 | A |   | 3/1993  | Ovshinsky et al. |         |
| 5,217,947 | A |   | 6/1993  | Barton et al.    |         |
| 5,294,600 | A |   | 3/1994  | Tanigaki et al.  |         |
| 5,340,796 | A |   | 8/1994  | Cava et al.      |         |
| 5,364,835 | A |   | 11/1994 | Yamazaki         |         |
| 5,561,102 | A |   | 10/1996 | Kao et al.       |         |
| 5,578,551 | A |   | 11/1996 | Chu et al.       |         |

(Continued)

FOREIGN PATENT DOCUMENTS

| JP | 02-107557 A | 4/1990 |            |
|----|-------------|--------|------------|
| JP | 02-199025 A | 8/1990 |            |
| JP | 04-104939   * 4/1992 | ............. C04B 35/00 |
| JP | 04-124003 A | 4/1992 |            |

OTHER PUBLICATIONS

Harshmann et al, "Theory of high-To superconductivity: transition temperature," J. Phys.: Condens. Matter 23 (2011) 295701 (17pp); Published Jul. 8, 2011.*

(Continued)

*Primary Examiner* — Stanley Silverman
*Assistant Examiner* — Kallambella Vijayakumar

(57) ABSTRACT

A composition of matter for a layered ionic superconductor comprising a plurality of layers of ions and electronic interaction charges, and having a substantially improved superconducting transition temperature is described. An aspect of the composition includes a first layer comprising a plurality of alkali ions and cesium ions in particular that is adjacent to a second layer comprising a plurality of halogen ions and fluorine ions in particular. The first and second layers contain electronic interaction charges and are separated by a predetermined perpendicular distance. Crystalline structure, ionic properties, superconducting transition temperature, and superfluid density for several embodiments including companion ionic species are described and illustrated. Methods for preparing the several embodiments are provided.

8 Claims, 7 Drawing Sheets

(56) References Cited

U.S. PATENT DOCUMENTS

| | | | |
|---|---|---|---|
| 5,776,861 | A | 7/1998 | Toth et al. |
| 5,858,926 | A | 1/1999 | Schwartz et al. |
| 6,239,080 | B1 | 5/2001 | Chu et al. |
| 6,284,712 | B1 | 9/2001 | Otto et al. |
| 6,300,284 | B1 | 10/2001 | Ihara et al. |
| 6,720,654 | B2 | 4/2004 | Stumborg et al. |
| 6,797,313 | B2 | 9/2004 | Fritzemeier et al. |
| 6,855,670 | B1 | 2/2005 | Gopalakrishnan et al. |
| 7,189,681 | B2 | 3/2007 | Miyamoto |
| 7,709,418 | B1 | 5/2010 | Chu |
| 7,910,155 | B2 | 3/2011 | Lee et al. |
| 8,055,318 | B1 | 11/2011 | Kadin |
| 2004/0016401 | A1 | 1/2004 | Ignatiev et al. |
| 2011/0002832 | A1 | 1/2011 | Hosono et al. |

OTHER PUBLICATIONS

Gao et al, "Superconductivity up to 164 K in $HgBa_2Ca_{m-1}Cu_mO_{2m+2}+d$ (m = 1, 2, and 3) under quasihydrostatic pressures," Physical Review B vol. 50, No. 6 Aug. 1, 1994-II; pp. 4260-4263.*

C. Niu et al., "Low temperature growth of the infinite phase of $SrCuO_2$ by pulsed laser deposition," Journal of the American Chemical Society, vol. 114, issue 9, pp. 3370-3371 (Apr. 1992).

S.K. Bandyopadhyay et al., "Effect of alpha irradiation on polycrystalline Bi-2223 superconductors," Physica C: Superconductivity, vol. 228, issues 1-2, pp. 109-114 (Jul. 10, 1994).

L. Gao et al., "Superconductivity up to 164 K in $HgBa_2Ca_{m-1}Cu_mO_{2m+2}+\delta$ (m=1, 2, and 3) under quasihydrostatic pressures," Physical Review B, vol. 50, pp. 4260-4263 (Aug. 1, 1994).

D. Tristan Jover et al., "Pressure dependence of the superconducting critical temperature of $HgBa_2Ca_2Cu_3O_{8+y}$ and $HgBa_2Ca_3Cu_4O_{10+y}$ up to 30 GPa," Physical Review B, vol. 54, pp. 4265-4275 (Aug. 1, 1996).

Ren Zhi-An et al., "Superconductivity at 55 K in iron-based F-doped layered quaternary compound $Sm[O_{1-x}F_x]$ FeAs," Chinese Physics Letters, vol. 25, issue 6, p. 2215 (Jun. 2008).

A. Marouchkine, Room-temperature superconductivity, Cambridge International Science Publishing, Cambridge, UK, Feb. 2004, pp. 10-13.

R. Hott et al., "Superconducting materials—a topical review," in Frontiers of Superconducting Materials, A. Narlikar, Ed., Springer-Verlag, Berlin, 2004, pp. 11-14.

S. Shimizu et al., "Uniform mixing of antiferromagnetism and high-Tc superconductivity in multilayer copper oxides $Ba_2Ca_{n-1}Cu_nO_{2n}F_2$ (n=2,3,4) with apical fluorines: 63Cu-NMR/NQR and 19F-NMR studies," Physical Review B, vol. 79, pp. 064505-1:9 (Feb. 4, 2009).

A. Mann, "Still in suspense: A quarter of a century after the discovery of high-temperature superconductivity, there is still heated debate about how it works," Nature, vol. 475, pp. 280-282 (Jul. 21, 2011).

D. R. Harshman et al., "Theory of superconductivity: transition temperature," Journal of Physics: Condensed Matter, vol. 23, pp. 296701:1-17 (Jul. 8, 2011).

* cited by examiner

LAYERED IONIC SUPERCONDUCTOR

CROSS REFERENCE TO RELATED APPLICATIONS

Not Applicable.

STATEMENT REGARDING FEDERALLY SPONSORED RES. OR DEVELOPMENT

Not Applicable.

BACKGROUND

The field of the background relates to superconductor technology, and particularly to superconductor compositions having high superconducting transition temperatures and methods of forming materials comprising superconductor compositions.

BACKGROUND

Prior Art

The following is a tabulation of some prior art that presently appears relevant:

U.S. PATENTS

| Pat. No. | Kind Code | Issue Date | Patentee |
|---|---|---|---|
| 3,932,315 | A | Jan. 13, 1976 | Sleight |
| 4,916,116 | A | Apr. 10, 1990 | Yamazaki |
| 5,004,725 | A | Apr. 2, 1991 | Ovshinsky et al. |
| 5,063,202 | A | Nov. 5, 1991 | Narayan |
| 5,081,103 | A | Jan. 14, 1992 | Gressler et al. |
| 5,132,281 | A | Jul. 21, 1992 | Chevallier et al. |
| 5,196,396 | A | Mar. 23, 1993 | Lieber |
| 5,198,414 | A | Mar. 30, 1993 | Ovshinsky et al. |
| 5,217,947 | A | Jun. 8, 1993 | Barton et al. |
| 5,294,600 | A | Mar. 15, 1994 | Tanigaki et al. |
| 5,340,796 | A | Aug. 23, 1994 | Cava et al. |
| 5,364,835 | A | Nov. 15, 1994 | Yamazaki |
| 5,561,102 | A | Oct. 1, 1996 | Kao et al. |
| 5,578,551 | A | Nov. 26, 1996 | Chu et al. |
| 5,776,861 | A | Jul. 7, 1998 | Toth et al. |
| 5,858,926 | A | Jan. 12, 1999 | Schwartz et al. |
| 6,239,080 | B1 | May 29, 2001 | Chu et al. |
| 6,284,712 | B1 | Sep. 4, 2001 | Otto et al. |
| 6,300,284 | B1 | Oct. 9, 2001 | Ihara et al. |
| 6,720,654 | B2 | Apr. 13, 2004 | Stumborg et al. |
| 6,797,313 | B2 | Sep. 28, 2004 | Fritzemeier et al. |
| 6,855,670 | B1 | Feb. 15, 2005 | Gopalakrishnan et al. |
| 7,189,681 | B2 | Mar. 13, 2007 | Miyamoto |
| 7,709,418 | B1 | May 4, 2010 | Chu |
| 7,910,155 | B2 | Mar. 22, 2011 | Lee et al. |
| 8,055,318 | B1 | Nov. 8, 2011 | Kadin |

U.S. PATENT APPLICATION PUBLICATIONS

| Publication No. | Kind Code | Publ. Date | Applicant |
|---|---|---|---|
| 2004/0016401 | A1 | Jan. 29, 2004 | Ignatiev et al. |
| 2011/0002832 | A1 | Jan. 6, 2011 | Hosono et al. |

FOREIGN PATENT DOCUMENTS

| Foreign Doc. No. | Cntry. Code | Kind Code | Publ. Date | Appl. or Patentee |
|---|---|---|---|---|
| 02-107557 | JP | A | Apr. 19, 1990 | Bardhan et al. |
| 02-199025 | JP | A | Aug. 7, 1990 | Horiuchi et al. |
| 04-124003 | JP | A | Apr. 24, 1992 | Takashima et al. |

NON-PATENT LITERATURE DOCUMENTS

C. Niu et al., "Low temperature growth of the infinite phase of $SrCuO_2$ by pulsed laser deposition," Journal of the American Chemical Society, vol. 114, issue 9, pp. 3370-3371 (April, 1992).

S. K. Bandyopadhyay et al., "Effect of alpha irradiation on polycrystalline Bi-2223 superconductors," Physica C: Superconductivity, vol. 228, issues 1-2, pp. 109-114 (Jul. 10, 1994).

L. Gao et al., "Superconductivity up to 164 K in $HgBa_2Ca_{m-1}Cu_mO_{2m+2+\delta}$ (m=1, 2, and 3) under quasihydrostatic pressures," Physical Review B, vol. 50, pp. 4260-4263 (Aug. 1, 1994).

D. Tristan Jover et al., "Pressure dependence of the superconducting critical temperature of $HgBa_2Ca_2Cu_3O_{8+y}$ and $HgBa_2Ca_3Cu_4O_{10+y}$ up to 30 GPa," Physical Review B, vol. 54, pp. 4265-4275 (Aug. 1, 1996).

Ren Zhi-An et al., "Superconductivity at 55 K in iron-based F-doped layered quaternary compound $Sm[O_{1-x}F_x]FeAs$," Chinese Physics Letters, vol. 25, issue 6, p. 2215 (June, 2008).

A. Marouchkine, Room-temperature superconductivity, Cambridge International Science Publishing, Cambridge, UK, February 2004.

R. Hott et al., "Superconducting materials—a topical review," in Frontiers of Superconducting Materials, A. Narlikar, Ed., Springer-Verlag, Berlin, 2004.

S. Shimizu et al., "Uniform mixing of antiferromagnetism and high-$T_c$ superconductivity in multilayer copper oxides $Ba_2Ca_{n-1}Cu_nO_{2n}F_2$ (n=2,3,4) with apical fluorines: $^{63}$Cu-NMR/NQR and $^{19}$F-NMR studies," Physical Review B, vol. 79, pp. 064505-1:9 (Feb. 4, 2009).

A. Mann, "Still in suspense: A quarter of a century after the discovery of high-temperature superconductivity, there is still heated debate about how it works," Nature, vol. 475, pp. 280-282 (Jul. 21, 2011).

In relation to superconductor technology, prior art includes a composition of a superconductor material having a high superconducting transition temperature Tc. High Tc and high current carrying capacity in a superconducting material provide an advantageous energy efficiency in operating a device or machine comprising the superconducting material. Applications of superconductor technology include systems for energy, electronics, information, and transportation. Improvements that increase Tc are therefore advantageous for superconductor technology, particularly for operation close to the sublimation temperature of dry ice at atmospheric pressure, which is −78 Celsius (−78° C.) or 195 Kelvins (195 K).

At present, the highest practical Tc is about 150 K. An example of a superconductor composition is a compound comprising mercury (Hg), barium (Ba), calcium (Ca), copper (Cu), and oxygen (O) in the approximate ratios 1:2:2:3:8. As disclosed in U.S. Pat. No. 5,578,551 to Chu et al. and U.S. Pat.

No. 5,858,926 to Schwartz et al., this composition, commonly denoted as Hg-1223, has Tc of 135 K. By applying hydrostatic pressure to Hg-1223, Tc can be raised to over 145 K. Substituting thallium (Tl) for Hg produces a related Tl-1223 composition having Tc of 133.5 K. There is also a composition Tl-2223 having twice the relative amount of Tl and having Tc of 130 K. Another related composition Hg-2223 and a Hg—Tl mixture (Hg,Tl)-2223, having Tc less than 130 K, are disclosed in U.S. Pat. No. 5,776,861 to Toth et al.

Other atomic elements are used in forming compositions of high Tc superconductors. As disclosed in U.S. Pat. No. 6,284,712 to Otto et al., the elements bismuth (Bi) and lead (Pb) are combined with strontium (Sr), Ca, Cu, and O in a composition (Bi,Pb)—Sr—Ca—Cu—O. In the approximate ratios (1.84, 0.34): 1.91:2.03:3.05:10, a composition (Bi,Pb)-2223 having Tc of 112 K is formed. U.S. Pat. No. 6,855,670 to Gopalakrishnan discloses several compositions of Bi—Sr—Ca—Cu—O that resemble Bi-2223 and have Tc of about 115 K.

All of the superconductor compositions described above are examples of a cuprate material having a perovskite crystal structure. The cuprates contain one or more layers comprising one Cu ion per two O ions and the layers are commonly referred to as cuprate planes and cuprate layers. The compositions also comprise cations of one or more elements having multiple oxidation states or having a multiple valence, in particular Hg, Tl, Bi, and Pb, and one or more divalent alkaline-earth elements, in particular Ba, Sr, and Ca. Cuprate materials designated with the suffixes 1223 and 2223 are formed with three cuprate layers corresponding to a formula unit. Sandwiched in between a pair of cuprate layers is a layer consisting of Ca ions.

The cuprate layer contains a mobile charge comprising a fraction of the elementary charge on the electron. As disclosed in FIGS. 2-3 in U.S. Pat. No. 6,300,284 to Ihara et al., the fractional charge is approximately one-quarter of an electron per Cu ion in a cuprate layer in compositions having the highest values of Tc.

Superconductors comprising three cuprate layers, and in particular also including Hg, appear to have Tc approaching 150 K. However, a device, a machine, or a system utilizing a superconductor is operated at a temperature substantially lower than the Tc of the superconductor material. Operating a superconducting material at a temperature below about 85% of Tc provides a practical engineering margin. Superconductors containing copper are typically operated near the boiling point of liquid nitrogen at atmospheric pressure, which is a temperature of about 77 K.

As disclosed in U.S. patent application publication 2011/0002832 by Hosono et al., a composition of iron (Fe), arsenic (As), O, and a lanthanoid element or lanthanum (La) becomes a superconductor upon partial substitution of the O with fluorine (F). A superconductor comprising samarium (Sm), O, F, Fe, and As in relative proportions 1:0.65:0.35:1:1 has Tc of 55 K. In superconductor compositions containing Fe—As—O, singly negatively-charged fluorine ions substitute for a portion of the doubly negatively-charged oxygen ions.

Superconductors have been formed using a composition comprising singly positively-charged alkali ions including potassium (K), rubidium (Rb), and cesium (Cs). An example comprising iron and arsenic is a composition of Ba—K—Fe—As having the relative proportions of 0.6:0.4:2:2 and having Tc of 37 K.

Other are compositions comprising iron and selenium (Se). A binary compound FeSe consisting of about 2.7% Se vacancies, which is composed of one part Fe to 0.973 part Se, has Tc of about 36.5 K under an applied pressure. A compound of FeSe with about 15% Fe vacancies and intercalated with an alkali ion including K, Rb, and Cs is a superconductor with Tc near 30 K. Iron compounds containing Se in place of As do not have substantially improved or raised Tc.

The highest Tc of a composition containing iron and arsenic is generally lower than the highest Tc of a composition containing copper. Therefore, superconductors containing iron are relatively less advantageous than superconductors containing copper.

Inclusion of F ions is believed to be advantageous for improving superconductors containing copper. Substitution of F ions for O ions in a composition of neodymium (or other rare earth or element), Cu, and O, and having a perovskite structure, is disclosed in Japanese patent publication 04-124003 by Takashima et al. Japanese patent publication 02-199025 by Horiuchi et al. and U.S. Pat. No. 4,916,116 to Yamazaki disclose methods for incorporating F in various cuprate superconductors. A fluoride-enhanced superconductor comprising yttrium (Y), Ba, Cu, and O is disclosed in Japanese patent publication 02-107557 by Bardhan et al. and in U.S. Pat. No. 5,004,725 to Ovshinsky et al. None of the methods in prior art for forming materials comprising fluorine has produced a superconductor composition with a Tc above 150 K.

Another method for including F ions is forming a copper oxyfluoride that comprises layers of F ions in addition to layers containing oxygen ions. The oxyfluoride compositions generally have Tc substantially lower than 150 K.

A superconductor consisting of a fullerene carbon molecule and an alkali ion is disclosed in U.S. Pat. No. 5,196,396 to Lieber. A particular material consisting of the fullerene C60 and Cs in relative proportion 1:3 has Tc of about 40 K. According to U.S. Pat. No. 7,189,681 to Miyamoto, a composition containing the fullerene C20 in the form of a polymer chain structure could have Tc above 100 K.

An oxide superconductor comprising Ba—Pb—Bi—O in which part of the Ba is replaced by Cs or another alkali ion is disclosed in U.S. Pat. No. 3,932,315 to Sleight. Compositions with these constituents have Tc of 12.5 K or less. Another oxide composition involving Bi is Cu—Bi—Sr—Cu—O and having Tc possibly as high as 107 K is disclosed in U.S. Pat. No. 5,340,796 to Cava et al.

Prior art includes various methods for manufacturing superconductor compositions. In U.S. Pat. No. 6,797,313 to Fritzemeier et al., a reactant gas in used to convert a precursor barium fluoride film into a superconducting film comprising yttrium, barium, and copper. A similar composition is disclosed in U.S. Pat. No. 7,709,418 to Chu. A method of film deposition by metal-organic chemical vapor deposition is described in U.S. Pat. No. 7,910,155 to Lee et al. A plasma or sputtering deposition method is disclosed in U.S. Pat. No. 8,055,318 to Kadin. A method of forming a superconductor material on a tape substrate is disclosed in U.S. patent application 2004/0016401 by Ignatiev et al.

Methods and compositions in the prior art include forming materials comprising various elements selected from the group consisting of alkali metals, alkaline earths, halogens, oxygen, and multiple valence elements including Hg, Bi, Pb, Cu, and Tl. The materials comprising these elements and known to the prior art yield superconductor compositions having Tc of at most about 150 K. Prior art does not provide a principle or a rule for determining Tc of a superconducting composition and in particular for determining Tc substantially greater than about 150 K.

BRIEF SUMMARY

In accordance with an aspect of an embodiment, a composition of material forming a layered ionic superconductor comprises a plurality of a first kind of layers comprising positive cesium ions and a plurality of a second kind of layers comprising negative fluorine ions, wherein a layer of cesium ions is adjacent to a layer of fluorine ions and is separated therefrom by a predetermined distance. The layers comprising cesium and fluorine ions further comprise a multitude or a plurality of electronic interaction charges. An aspect of the composition includes a third kind of layer of ions adjacent to a layer of cesium ions and a fourth kind of layer of ions adjacent to a layer of fluorine ions. Several embodiments are described and illustrated in the drawings.

ADVANTAGES

Accordingly several advantages of one or more aspects of a layered ionic superconductor are as follows: to provide a composition of matter forming a superconductor having a superconducting transition temperature substantially above 150 K, and in particular having a substantial density of superconducting current flowing near the dry ice temperature. Other advantages of one or more aspects of the composition for superconductor machines and devices will be apparent from a consideration of the drawings and ensuing description.

BRIEF DESCRIPTION OF THE DRAWINGS

So that those having ordinary skill in the art will have a better understanding of how to make and use the disclosed superconducting composition, reference is made to the accompanying drawings. The following describes the drawings, wherein.

DRAWING FIGURE REFERENCE NUMERALS

Figure 1A:
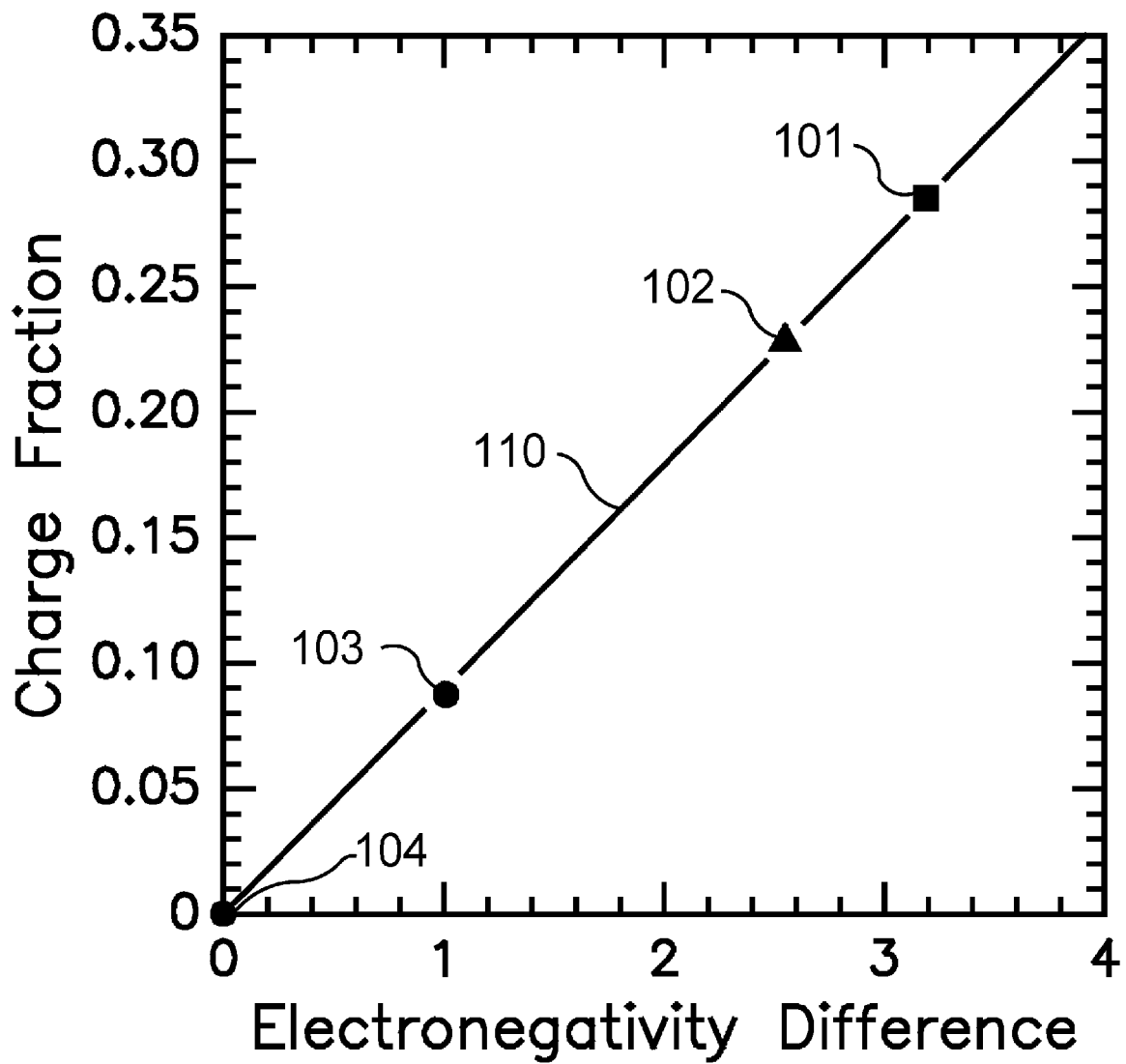
FIG. 1A shows charge fraction as function of electronegativity difference.

The first digit of a drawing numeral corresponds to a figure number. In regard to FIGS. 2 and 3, a numeral with letter suffix distinguishes an ion sharing a layer; a numeral with a prime suffix denotes an ion, a layer, or a group of layers of same kind as that of the unprimed numeral. Descriptions of the numerals comprise:

| | | | |
|---|---|---|---|
| 101 | valence 1 datum | 102 | valence 2 datum |
| 103 | valence 3 datum | 104 | valence 4 datum |
| 110 | function line | 120 | type 1 layer |
| 130 | type 2 layer | 121 | cation |
| 131 | anion | 140 | ion spacing |
| 150 | layer spacing | 160 | electronic interaction charge |
| 170 | electronic interaction charge | 180 | electronic interaction charge spacing |
| 190 | electronic interaction charge spacing | 200 | crystal structure |
| 201 | ion group of type 1 | 202 | ion group of type 2 |
| 204 | atomic spacing | 221, 223, 225 | halogen ion |
| 222A, 224A | cation | 222B, 224B | oxygen ion |
| 226, 229 | alkali ion | 227A, 228A | cation |
| 227B, 228B | oxygen ion | 301 | ion group of type 1 |
| 302, 302' | ion group of type 2 | 305 | atomic spacing |
| 321, 323, 325 | halogen ion | 322A, 324A | cation |
| 321', 323', 325' | | 322A', 324B' | |
| 322B, 324B | oxygen ion | 326, 329 | alkali ion |
| 322B', 324B' | | | |
| 327A, 328A | cation | 327B, 328B | oxygen ion |
| 311-314 | type 1 layers | 315-319, 315'-319' | type 2 layers |
| 350, 350' | interlayer spacing | 401 | datum for Sm—O—F—Fe—As |
| 402 | datum for Hg—Ba—Ca—Cu—O | 403 | datum for Na—Cs—Bi—F—O |
| 404 | datum for Na—Cs—Bi—F—O | 410 | function line |
| 520, 530 | function curve | 521, 531 | superfluid density |
| 522, 532 | transition temperature | 527, 537 | liquid nitrogen temperature |
| 528, 538 | 150-K temperature | 539 | dry ice temperature |
| 600 | superconductor fabrication apparatus | 601 | process chamber |
| 602 | feed stock | 603 | product stock |
| 604 | work-piece substrate | 605 | oxygen supply |
| 607 | fluorine supply | 610 | vacuum pump |
| 615, 617 | gas lines | 620 | controller |
| 621, 622, 631 | control lines | 623, 626, 629 | control lines |
| 624, 625, 627, 628 | control lines | 630 | substrate heater |
| 633, 636, 639 | effusion cells | 634, 638 | atomic generators |
| 643, 646, 649 | effusion fluxes | 645, 647 | atomic fluxes |

ABBREVIATIONS AND SYMBOLS

A, B—Alphabetic notations representing atomic species

Tc—Superconducting transition temperature.

C—Proportionality constant for determining Tc.

C/LZ—Expression for determining Tc.

D—Thickness of one formula unit of composition.

G—Charge factor.

L—Mean intra-layer distance between electronic interaction charges.

N—Number of layers of second kind in type 2 group.

S—Charge in outer layer of type 1 group.

U—Relative valence.

V—Volume of one formula unit of composition.

X—Lattice spacing.

Z—Perpendicular distance between electronic interaction layers.

DETAILED DESCRIPTION

A composition of a material having a high superconducting transition temperature comprises a plurality of ions of atomic elements or atomic species arranged in several kinds of layers. The layers of ions are grouped according to two types distinguished as a type 1 group and a type 2 group.

The type 1 group includes a first kind of layer comprising a plurality of a first species of ions. The type 2 group includes a second kind of layer comprising a plurality of a second species of ions. The type 1 group further includes a third kind of layer comprising a third species of ions. The type 2 group further includes a fourth kind of layer comprising a fourth species of ions.

The type 1 group comprises two of the first kind of layers in between which are sandwiched one or more of the third kind of layers. In the type 1 group, the first kind of layers are positioned as outer layers and the third kind of layer is positioned as an inner layer.

The type 2 group comprises two or more of the second kind of layers. A fourth kind of layer is sandwiched in between two of the second kind of layers. In the type 2 group, two of the second kind of layers are positioned as outer layers and the fourth kind of layer is positioned as an inner layer.

In a layered ionic superconductor, a type 1 group is adjacent to a type 2 group, wherein an outer layer of the type 1 group is adjacent to an outer layer of the type 2 group. The structure of a superconductor composition comprises a plurality of alternately stacked type 1 and type 2 groups.

By means of ionic doping and ionic charge transfer, the inner layers of the type 1 group provide a multitude or a plurality of mobile electronic charges. An electrical current in a superconducting composition comprises a transport or a flow of the mobile electronic charges. The electrical current flows in a direction substantially parallel to the layers. The electronic charge is a predetermined fraction of the elementary charge on an electron or a charge fraction. The charge fraction resides on a plurality of layers within the composition.

The first species of ions in the first kind of layer in the type 1 group comprises an ion of an atomic species or an atomic element represented by the alphabetic notation A. The second species of ions in the second kind of layer in the type 2 group comprises an ion of an atomic species represented by the alphabetic notation B.

The atomic species A and B have chemical valences of opposite signs and in particular element A has a positive valence and element B has a negative valence. In addition, element A has a low electronegativity and element B has a high electronegativity. The charge fraction tends to grow with the difference between the electronegativities, expressed as the electronegativity of species B relative to the electronegativity of species A. On the other hand, the charge fraction tends to diminish with increasing absolute-value of the valences of the species A and species B.

FIG. 1A is a plot of the charge fraction as a function of an electronegativity difference between two atomic species representing the species A and B. The Pauling scale of the electronegativities of the elements is used.

Datum 104 represents atomic species having an absolute-value of valence close to 4, for which an electronegativity difference is very small, a charge fraction is also very small, and a composition comprising the species is non-superconducting or has a very low Tc. Datum 103 is obtained from the superconductor Sm—O—F—Fe—As having a charge fraction of 0.0875. This composition has about the highest Tc among compositions comprising iron and wherein the absolute-value of the valences of A and B equals 3. Species A is Sm having +3 valence and electronegativity of 1.17. Species B is As having −3 valence and electronegativity of 2.18. Datum 102 is obtained from a Hg-1223 composition that has about the highest Tc among compositions having a perovskite crystal structure and containing copper, and which has a charge fraction of 0.228. The absolute value of the valences equals 2, wherein species A is Ba having +2 valence and electronegativity of 0.89 and species B is O having −2 valence and electronegativity 3.44. Datum 101 is an aspect of a composition disclosed in this specification, wherein species A is Cs having a +1 valence and electronegativity 0.79 and species B is F having a −1 valence and electronegativity of 3.98. A composition comprising Cs and F has a charge fraction of at least 0.285. A diagonal line 110 having a slope of 0.0894 and passing through the origin defines a linear proportionality between the charge fraction and the electronegativity difference.

In some superconducting compositions, the outer layer of the type 1 group comprises a first species of a companion ion in addition to the species A. In some superconducting compositions the outer layer of the type 2 group comprises the species B and a second species of a companion ion. In some cuprate compositions, oxygen is used as the first species of the companion ion in an outer layer of a type 1 group and copper is used as the second species of the companion ion in an outer layer of a type 2 group. A companion ion is not used in the type 1 group in some compositions comprising a single cuprate layer. A companion ion is not used in forming numerous compositions comprising iron, and also cesium and fluorine.

An outer layer of the type 1 group comprising ions of species A is adjacent to an outer layer of the type 2 group comprising ions of species B. Centers of the ions of the species A determine a first plane. Centers of the ions of the species B determine a second plane. An inter-layer distance Z is determined by the perpendicular distance between the first plane and the second plane.

The outer layer of the type 1 group is a first kind of electronic interaction layer comprising a multitude or a plurality of a first type of electronic interaction charge. The adjacent outer layer of the type 2 group is a second kind of electronic interaction layer comprising a multitude or a plurality of second type of electronic interaction charge. A positive or a negative sign is associated with the type of an electronic interaction charge. The type, first or second, for designating an electronic interaction charge corresponds to the type, 1 or 2, for designating a group comprising the charge.

An intra-layer lattice spacing X measures a distance separating two nearest ions of the species A within the first plane. An intra-layer distance between ions of the species B in the second plane is also about X.

In accordance with FIG. 1A, a charge fraction is associated with the pair of atomic species A and B. In a design of a composition of a layered ionic superconductor, the outer layers of the type 1 group provides an electronic charge S determined by taking the product of the charge fraction and a predetermined charge factor G. Superconductivity in the composition is provided by an electronic interaction charge equal to the product of N and S or algebraically NS. The first kind of electronic interaction layer comprises the first type of electronic interaction charges having a two-dimensional areal density of $NS/X^2$, wherein $X^2$ is the square of the distance X for ions on a square lattice. A mean intra-layer distance L between the first type of electronic interaction charges is obtained by taking the inverse square-root of the areal density and is expressed as $X/\sqrt{NS}$. In numerous superconductor compositions, the second type of electronic interaction charges has about the same charge density as the first type of electronic interaction charges.

A set of materials parameters specifying the design of a layered ionic superconductor comprises the charge S, the number N of layers comprising species B in the type 2 group, the intra-layer distance X, the inter-layer distance Z, and the mean intra-layer distance L between electronic interaction charges.

Figure 1B:
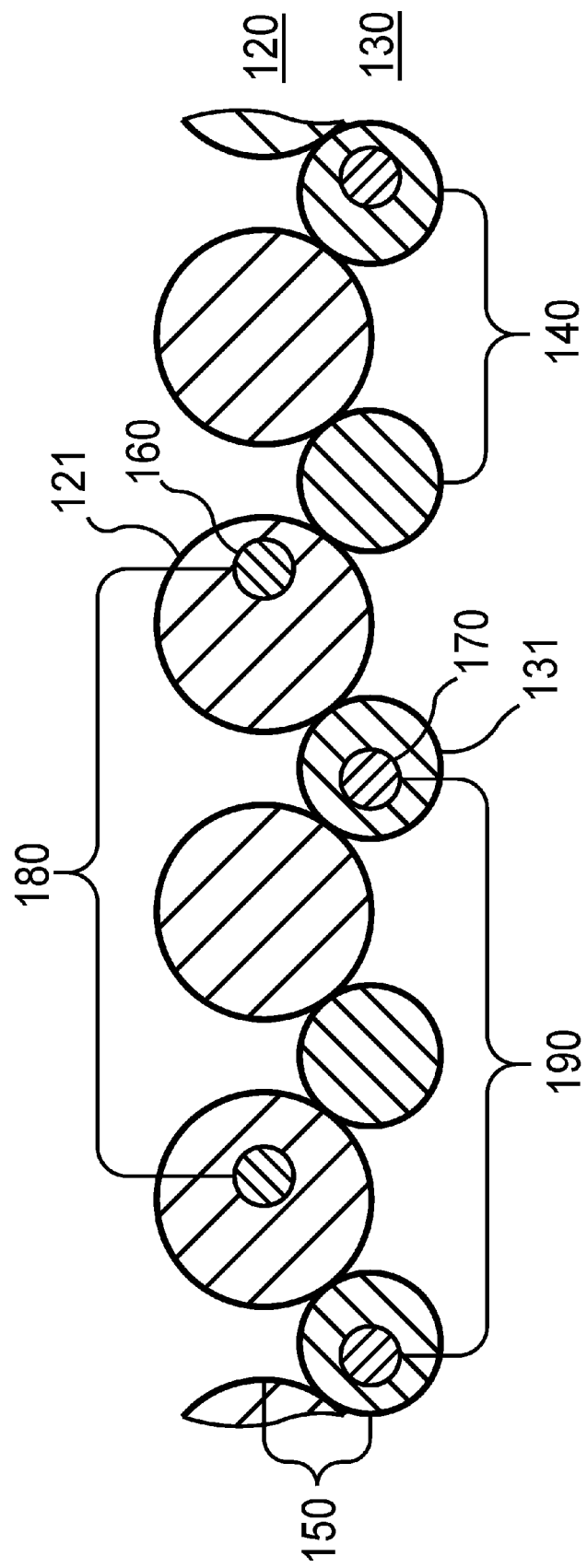
FIG. 1B is a section view of a model of a layered ionic superconductor.

FIG. 1B is a cross section view of the two kinds of electronic interaction layers in a layered ionic structure, including enumerated braces illustrating several design parameters. A first layer 120 comprises a plurality of ions exemplified by an ion 121 representing species A in an outer layer of a type 1 group. An adjacent second layer 130 comprises a plurality of ions exemplified by an ion 131 representing species B in an outer layer of a type 2 group. The structure repeats and continues in a direction parallel to the layers with a periodicity distance 140. A distance 150 separates the layer 120 from the layer 130.

Layer 120 contains a plurality of a first type of electronic interaction charges exemplified by an electronic interaction charge 160 and a mean distance 180 between the electronic interaction charges. Layer 130 contains a plurality of a second type of electronic interaction charges exemplified by a charge 170 and a mean distance 190 between the electronic interactions charges. An electronic interaction charge occupies a region within a layer that is substantially wider than the distances 180 and 190.

The design parameter Z is the distance 150. The design parameter L is the distance 180. The distance 190 is about equal to the distance 180.

In an aspect of FIG. 1B, species A is cesium (Cs), and species B is fluorine (F). No companion ions or other ions are used in either layer. The layer 120 comprises singly positively charged $Cs^{+1}$ ions exemplified by ion 121 and the layer 130 comprises singly negatively charged $F^{-1}$ ions exemplified by ion 131. An ionic radius of about 0.181 nm for a $Cs^{+1}$ ion and an ionic radius of about 0.119 nm for a $F^{-1}$ ion determines a distance of about 0.300 nm between a $Cs^{+1}$ ion and a nearest-neighbor $F^{-1}$ ion. The distance 140 of about 0.486 nm is determined by distances between ions within an inner layer of the type 1 group and ions within an inner layer of the type 2 group.

A transition temperature of a layered ionic superconductor is specified by a principle expressed mathematically as Tc=C/LZ and containing a proportionality constant C equal to 12.47 $K\,nm^2$. The expression C/LZ determines Tc to an accuracy of plus or minus 1.4 K at one standard deviation of normal error.

Values of the parameters L and Z for 40 superconductors of various compositions are listed in Table 1. A letter d in the subscript for the O content denotes a fraction with an absolute value of less than about 0.5. Listed are 2 compositions comprising Cs and F, 26 compositions comprising copper, and 12 compositions comprising iron. For example, the composition $HgBa_2Ca_2Cu_3O_{8+d}$ having Tc of 135 K has N equal to 3, Z equal to 0.1996 nm, X equal to 0.3848 nm, G equal to 1, S equal to 0.228, and L equal to 0.4653 nm. For this composition, the expression C/LZ determines a Tc of 134.33 K.

First Embodiment—FIGS. 2-5

A composition of a first embodiment of a layered ionic superconductor comprises 3 of the second kind of layers of the second species of ions in the type 2 group. For this composition, the number N equals 3. The first embodiment is presently believed to operate most efficiently, but the other embodiments are also satisfactory.

Figure 2:
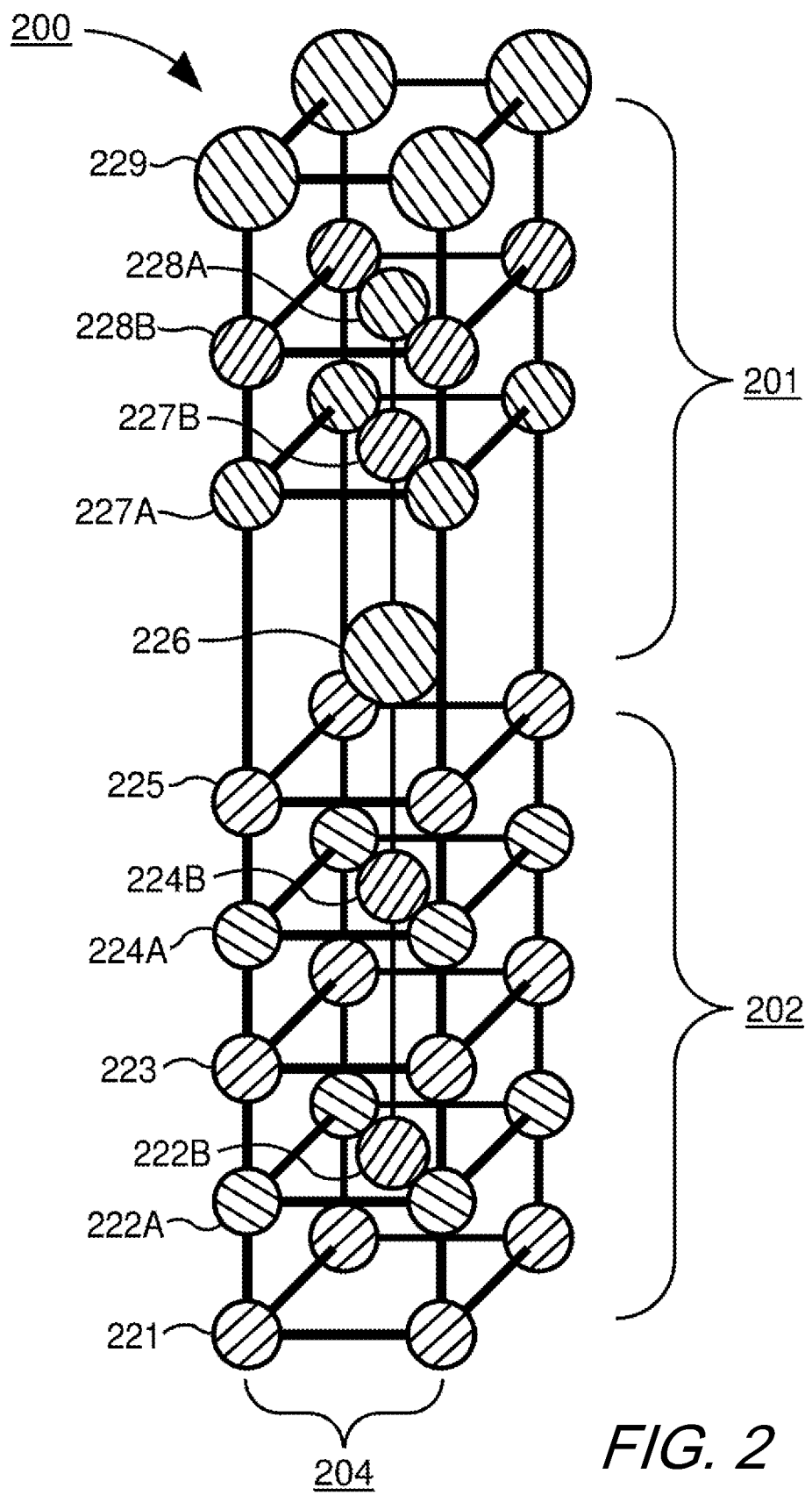
FIG. 2 is a perspective view of a crystal structure.

An aspect of the first embodiment includes a structure 200 shown in a perspective view in FIG. 2. The drawing shows a ball-and-stick model wherein hatched circles represent ions in an elementary portion of a unit cell in a crystal structure and line segments join some of the neighboring ions as guides to visualizing the crystal structure. In reference to a viewer's orientation of the drawing, the ions occupy horizontal layers and the layers are stacked along the vertical direction. The drawing shows 9 ionic layers representing one formula unit of a chemical compound comprising the superconductor material. Ions sharing an ionic layer have the same numerical value of a numeral and are distinguished by an alphabetic letter suffix.

A numeral 204 indicates a horizontal crystalline lattice spacing representing a value for the distance X.

Ions represented by a series of numerals from 226 to 229 inclusive comprise layers of a type 1 group 201. A first outer layer of the type 1 group comprises ion 226. A second outer layer of the type 1 group comprises ion 229. A first inner layer of the type 1 group comprises ions 227A and 227B. A second inner layer of the type 1 group comprises ions 228A and 228B. The ions 227A and 227B of the first inner layer form an approximately centered square arrangement. The ions 228A and 228B of the second inner layer form an approximately centered square arrangement that is horizontally offset relative to the first inner layer by a distance half-way along the diagonal across the square. Ions 227A and 228A are cations of the same atomic species. Ions 227B and 228B are anions of the same atomic species. Ions 226 and 229 are alkali cations and represent the atomic species A in a superconductor composition.

Ions represented by a series of numerals from 221 to 225 inclusive comprise layers of a type 2 group 202. In the type 2 group, a first outer layer comprises ion 221, a second outer layer comprises ion 225, and a middle layer comprises ion 223. A first inner layer comprises ions 222A and 222B and a second inner layer comprises ions 224A and 224B. The ions comprising an inner layer form an approximately centered square arrangement that is the same for both inner layers. Ions 222A and 224A are cations of the same species. Ions 222B and 224B are anions of the same species. Ions 221, 223, and 225 are halogen anions and represent the atomic species B in a superconductor composition.

Figure 3:
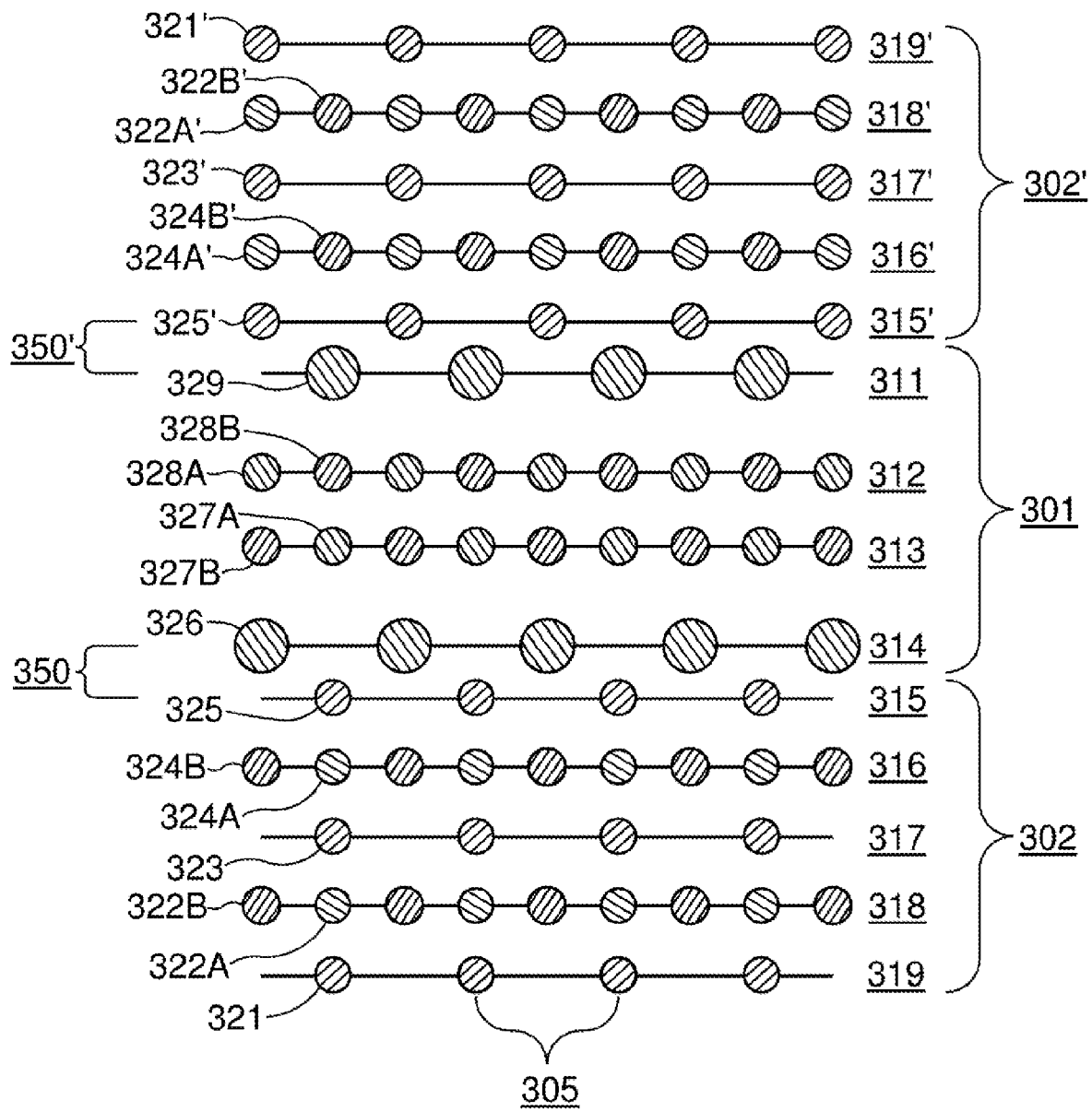
FIG. 3 is a section view of a structure in a (110) crystal plane.

FIG. 3 is a view of the crystal structure in a (110) crystallographic plane. Horizontal line segments connect ions comprising a layer. A numeral 305 denotes a horizontal repeat distance which is equal to $\sqrt{2}X$. The view shows four crystallographic repeat distances in a horizontal direction and one crystallographic repeat distance in a vertical direction. The vertical repeat distance comprises one type 1 group 301, a first type 2 group 302, and a second type 2 group 302'. The first type 2 group is horizontally offset relative to the second type 2 group by one-half of the horizontal repeat distance. The (110) view is related to the perspective view of FIG. 2 in that the (110) plane is oriented vertically and passes through the centers of catercorner ions comprising a horizontally oriented square.

For each ionic species, a corresponding numeral is used in FIGS. 2 and 3, wherein the leading digits are 2 and 3, respectively, and the remaining digits are the same. Ionic species 321 through 329 are identical to the ionic species 221 through 229, respectively.

In FIG. 3, ionic species 321' through 329' comprising the second type 2 group 202' are identical to the ionic species 321 through 329, respectively, comprising the first type 2 group 202.

In the type 1 group 301, the outer layers comprise layers 311 and 314; and the inner layers comprise layers 312 and 313. In the type 2 group 302, the outer layers comprise layers 315 and 319; the middle layer is layer 317; and the inner layers comprise layers 316 and 318.

Layers 314 and 315 comprise the two kinds of electronic interaction layers and are separated by distance 350 representing the distance Z. Layers 311 and 315' comprise an equivalent two kinds of electronic interaction layers separated by a distance 350' that is equivalent to the distance 350. In reference to FIG. 1B, the type 1 layer 314 is equivalent to the layer 120, the type 2 layer 315 is equivalent to the layer 130, the distance 350 is equivalent to the distance 150, and the distance 305 is equivalent to the distance 140.

An aspect of the first embodiment consists of five elements and comprises cesium (Cs), fluorine (F), sodium (Na), bismuth (Bi), and oxygen (O). The species denoted as A in the type 1 group is Cs. The species denoted as B in the type 2 group is F. In reference to FIG. 2, the ions 226 and 229 are $Cs^{+1}$ ions in a +1 valence state. The anions 221, 223, and 225 are $F^{-1}$ ions in a −1 valence state.

The cations 227A and 228A in the inner layers of the type 1 group are $Na^{+1}$ ions in a +1 valence state. The anions 227B and 228B in the inner layers of the type 1 group are $O^{-2}$ ions in about a −2 valence state.

The cations 222A and 224A in the inner layers of the type 2 group are multiple-valence Bi ions having an average oxidation state or a valence state of about +3.5. The anions 222B and 224B in the inner layers of the type 2 group are $O^{-2}$ ions in about a −2 valence state.

A chemical formula for an aspect of the composition 200 is $Na_2Cs_2Bi_2F_3O_4$ in the approximate ratios 2:2:2:3:4.

A separation between a Na ion adjacent to an O ion in an inner type 1 layer is about the same as a separation between a Bi ion adjacent to an O ion in the inner type 2 layer. The separations are about 0.243 nm. The distance X is a factor of $\sqrt{2}$ larger than the separations and is about 0.343 nm.

The distance Z, measured perpendicularly between the adjacent planes comprising the $Cs^{+1}$ ions in an outer layer of the type 1 group and the $F^{-1}$ ions in an outer layer of the type 2 group, is about 0.179 nm.

The total thickness of the 4 layers comprising the type 1 group is about 1.032 nm. The total thickness of the 5 layers comprising the type 2 group is about 1.120 nm. The thickness of the 9 layers comprising the type 1 and type 2 groups is denoted by a symbol D and has a value of about 2.152 nm.

The charge S is the charge fraction 0.285 determined by the datum 101 in FIG. 1A multiplied by the factor G of about 1+U/2. An ionic valence difference or relative valence U is obtained from a charge difference between the cations and the anions comprising an inner layer of the type 1 group and a divisor of 2 accounts for the charge difference being shared by the two outer layers of the type 1 group. In the composition $Na_2Cs_2Bi_2F_3O_4$ having an inner layer comprising $Na^{+1}$ cations and $O^{-2}$ anions, U is about +1, and S is about 0.4275. The expression $X/\sqrt{NS}$ determining the mean distance L between the electronic interaction charges has a value of about 0.303 nm.

For numerous cuprate compositions, a charge fraction 0.228 determined from datum 102 is used. For example, in a cuprate composition having inner layers comprising an atomic species of Y, Tl, or Hg as cations and $O^{-2}$ as anions, the positive and negative ionic charges are nearly balanced, U is about zero, and S is about 0.228. In other cuprate compositions having inner layers comprising a species of Bi and/or Pb in an oxidation state of about +3 and $O^{-2}$ anions, U is about −1 and S is about 0.114.

Operation—First Embodiment

The transition temperature of $Na_2Cs_2Bi_2F_3O_4$ is about 230 K. The value of Tc is determined by the expression C/LZ.

Figure 4:
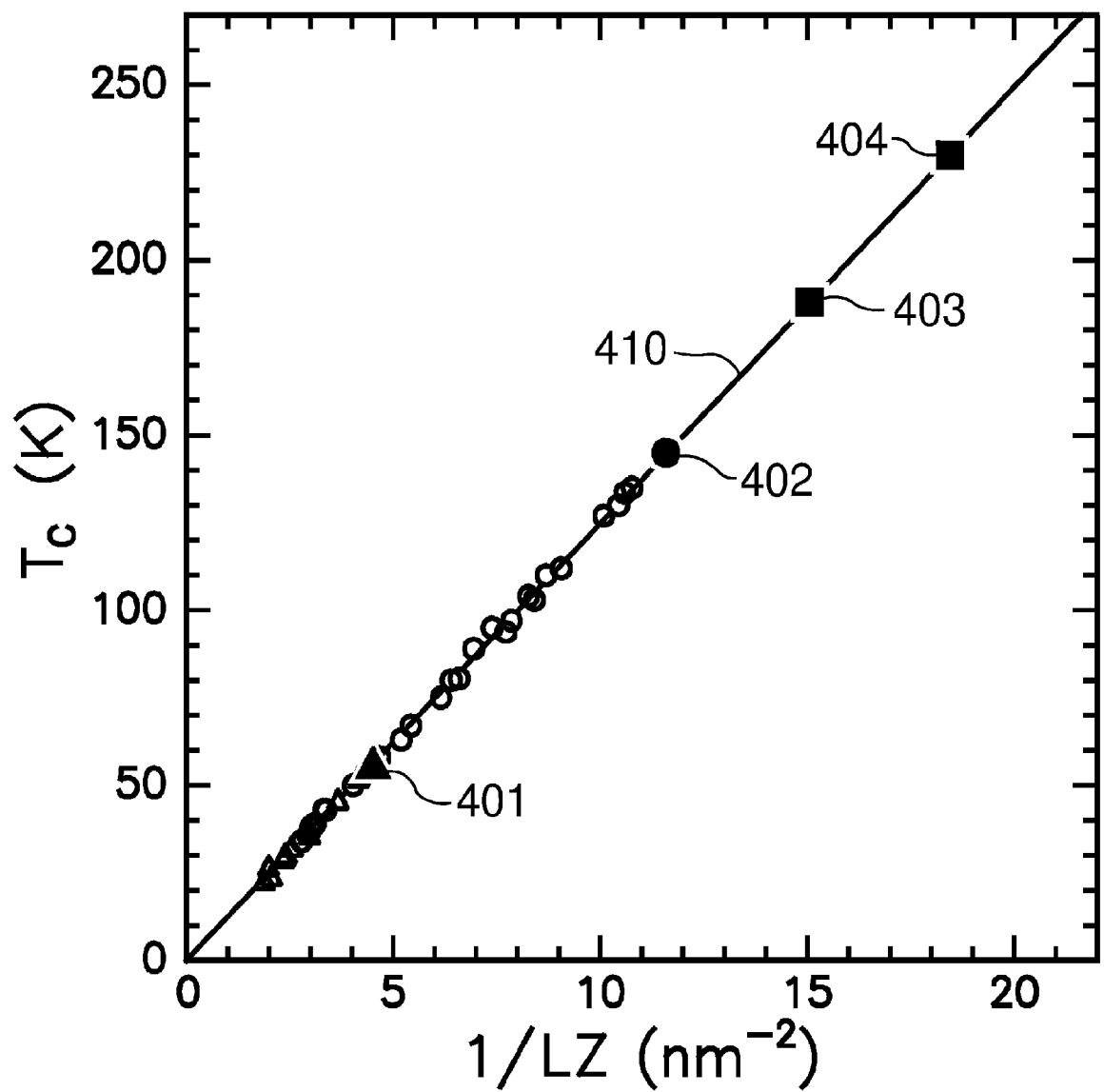
FIG. 4 shows superconductor transition temperature Tc as function of inverse product of material parameters L and Z.

FIG. 4 shows the variation of Tc with 1/LZ for the 40 different superconductor compositions listed in Table 1. Twenty-six different compositions comprising copper and other elements are represented by circular symbols. Twelve different compositions comprising iron and other elements are represented by triangular symbols. Two compositions comprising cesium, fluorine, and other elements are represented by filled square symbols 403 and 404. The composition $Na_2Cs_2Bi_2F_3O_4$ is represented by the filled square symbol 404.

A filled triangle 401 represents the composition Sm—O—F—Fe—As having about the highest Tc of 55 K among the compositions containing iron. A filled circle 402 represents the composition Hg-1223 having about the highest Tc of 145 K among the perovskite compositions containing copper. A diagonal line 410 exhibits the principle Tc=C/LZ. The close proximity of all of the data points to the diagonal line demonstrates that a layered ionic superconductor has a design accuracy of about 1.4 K in determining Tc. In comparison with various superconductors comprising iron or copper, the composition $Na_2Cs_2Bi_2F_3O_4$ has highest value of Tc.

A superconductor composition provides a mobile charge density determined by the charge S in an outer layer of the type 1 group and a volume V comprising one formula unit. The expression $X^2D$ determines the volume V, which for $Na_2Cs_2Bi_2F_3O_4$ is about 0.2532 $nm^3$. The two outer type 1 layers comprising $Cs^{+1}$ ions each contribute a charge S, forming a total charge of 2S per volume V. The expression 2S/V determines about 3.38 electronic charges per cubic nanometer or about 3.38 $nm^{-3}$.

At a temperature T that is lower than Tc, the superfluid density equals the value of 3.38 $nm^{-3}$ reduced by a factor given by the expression $[1-(T/Tc)^4]$ containing a temperature dependence for the portion of superfluid in a high-Tc superconductor. The largest superfluid density of 3.38 $nm^{-3}$ is reached for T substantially lower than Tc. The superfluid density is zero for T at or above Tc. The factor for the temperature dependence originates from the s-state valence electrons in the elements Cs and F that provide an isotropic superconducting state within the layers.

Figure 5:
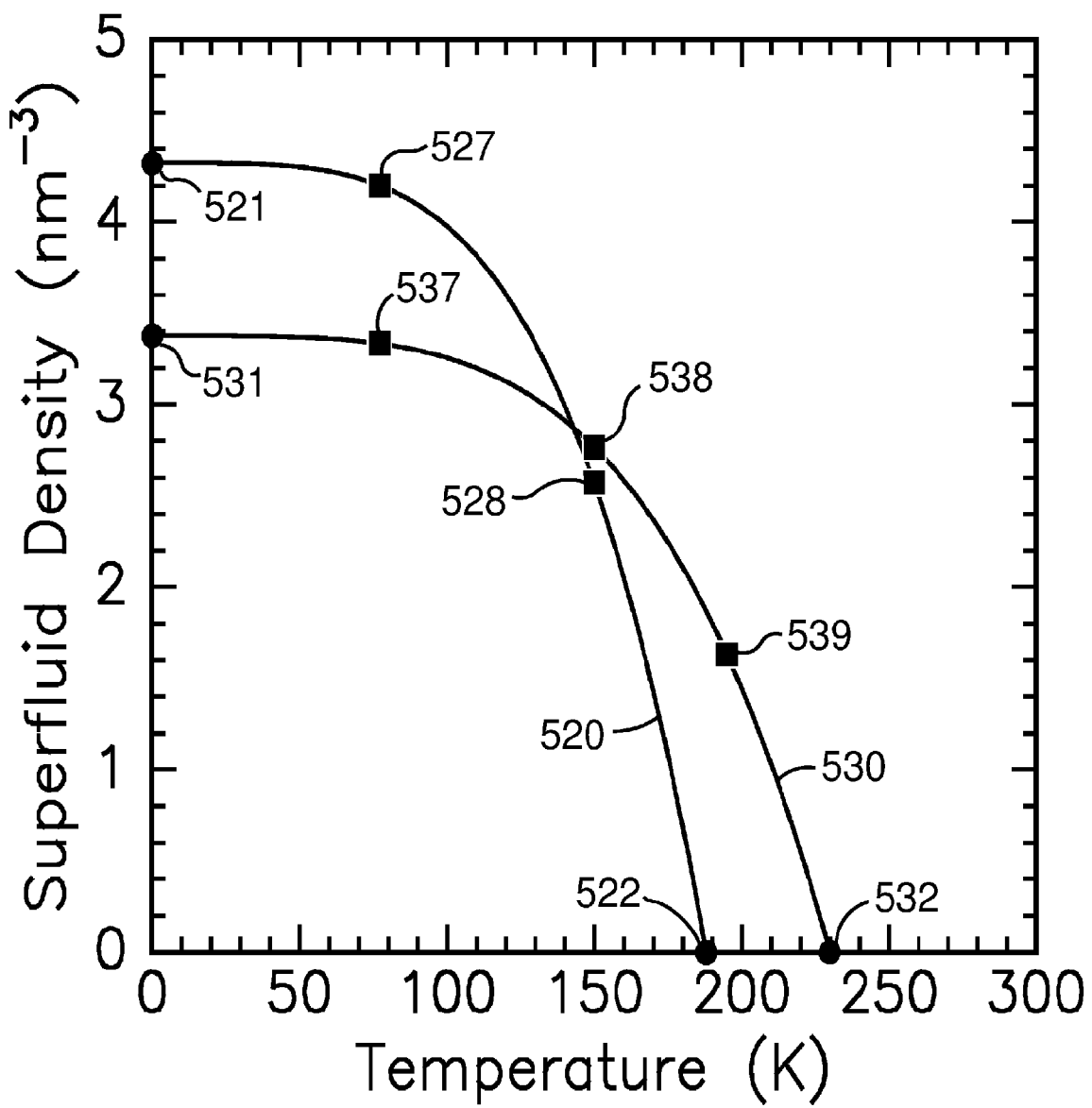
FIG. 5 shows superconductive carrier density as function of temperature.

FIG. 5 shows the temperature dependence of the superfluid density. Therein a datum 531 corresponds to 3.38 $nm^{-3}$ on the vertical or superfluid density scale and zero on the horizontal or temperature scale. A datum 532 corresponds to a zero or an absence of a superfluid density at a temperature equal to Tc. A curve 530 shows the temperature dependence of the superfluid density throughout the temperature region in which the composition $Na_2Cs_2Bi_2F_3O_4$ is superconducting. The data 531 and 532 are end points bounding the two limits of the curve 530.

At the liquid nitrogen temperature of 77K, the superfluid density of $Na_2Cs_2Bi_2F_3O_4$ is about 3.34 $nm^{-3}$ and indicated by datum 537. At the dry ice temperature of 195 K, the superfluid density is about 1.63 $nm^{-3}$ and indicated by datum 539. The composition $Na_2Cs_2Bi_2F_3O_4$ provides a substantial amount of superfluid density for carrying a superconducting current for devices and systems operated at the dry ice temperature and also at lower temperatures. For example, datum 538 corresponds to a superfluid density of 2.77 nm$^{-3}$ at a temperature of 150 K.

Second Embodiment—FIGS. 3-5

A composition of a second embodiment of a layered ionic superconductor comprises 2 of the second kind of layers of the second species of ions in the type 2 group. For this composition a type 1 group comprises 4 layers and a type 2 group comprises 3 layers wherein the number N is 2.

An aspect of a crystal structure comprising the second embodiment is derived by taking the composition illustrated in FIG. 3 and removing the layers in the type 2 group comprising layers 318, 319, 318', and 319' and the corresponding ions 322A, 322B, 321, 322A', 322B', and 321'. The following refers to FIG. 3 with removing the aforementioned layers and ions being understood. The type 2 group of the second embodiment comprises one inner layer 316, a first outer layer 315, and a second outer layer 317. The type 1 group comprises two inner layers 312 and 313; and two outer layers 311 and 314.

In an aspect of the composition, the ions 324A and 324A' are $Bi^{+3}$ ions, the ions 324B and 324B' are $O^{-2}$ ions, the ions 323, 325, 323' and 325' are F ions, the ions 326 and 329 are $Cs^{+1}$ ions, the ions 327A and 328A are $Na^{+1}$ ions, and the ions 327B and 328B are $O^{-2}$ ions. An aspect of the composition has a chemical formula $Na_2Cs_2BiF_2O_3$ in the approximate ratios 2:2:1:2:3. A crystallographic unit cell comprises a quantity of two formula units.

The outer layers 311 and 314 of the type 1 group and the outer layers 315 and 317 of the type 2 group comprise the two kinds of electronic interaction layers. The superconductivity occurs by an electronic interaction between layers 314 and 315, and also between layers 311 and 315'. The distance Z equals the projected vertical distance 350 between the center of the ion 326 in the layer 314 and the center of the ion 325 in the layer 315, and also equals the projected vertical distance 350' between the center of the ion 329 in the layer 311 and the center of the ion 325' in the layer 315'. In the aspect of the structure, the value of Z is about 0.179 nm, corresponding to the vertical distance between adjacent layers containing Cs and F ions. The value of X is about 0.343 nm, corresponding to the horizontal distance between nearest neighbor $F^{-1}$ ions. The composition $Na_2Cs_2BiF_2O_3$ provides a charge S of about 0.4275.

The expression $X/\sqrt{NS}$ determining the mean distance L between the electronic interaction charges has a value of about 0.371 nm. The total thickness of the 4 layers comprising the type 1 group is about 1.032 nm. The total thickness of the 3 layers comprising the type 2 group is about 0.649 nm. The 7 layers comprising the type 1 and type 2 groups have a combined thickness D of about 1.681 nm.

Operation—Second Embodiment

The transition temperature of the composition $Na_2Cs_2BiF_2O_3$ is about 188 K. The datum 403 represents the composition in the plot of Tc versus 1/LZ in FIG. 4.

The largest superfluid density of the composition at a low temperature is about 4.32 nm$^{-3}$. Curve 520 in FIG. 5 shows the temperature dependence of the superfluid density, wherein datum 521 corresponds to the limit of zero temperature and datum 522 corresponds to a temperature equaling Tc.

At the liquid nitrogen temperature of 77 K, $Na_2Cs_2BiF_2O_3$ provides a superfluid density of about 4.32 nm$^{-3}$ and indicated by datum 527 in FIG. 5. At the temperature of 150 K, the superfluid density is about 2.57 nm$^{-3}$ and indicated by datum 528.

Comparing a first composition $Na_2Cs_2Bi_2F_3O_4$ of the first embodiment to a second composition $Na_2Cs_2BiF_2O_3$ of the second embodiment, the first composition has a higher Tc, 230 K versus 188 K, owing to the larger N counting the number of layers comprising $F^{-1}$, 3 versus 2.

The first composition has a smaller superfluid density at a low temperature, 3.38 nm$^{-3}$ versus 4.32 nm$^{-3}$, owing to a larger value of D, 2.152 nm versus 1.681 nm. Consequently, there is a crossing of the curves 520 and 530 near a temperature of about 143 K, as exhibited in FIG. 4. The second composition provides a substantial superfluid density of 2.57 nm$^{-3}$ for carrying a superconducting current for devices and systems operated at 150 K and also at lower temperatures. For example, the superfluid density at a temperature of 77 K is about 4.20 nm$^{-3}$.

Figure 6:
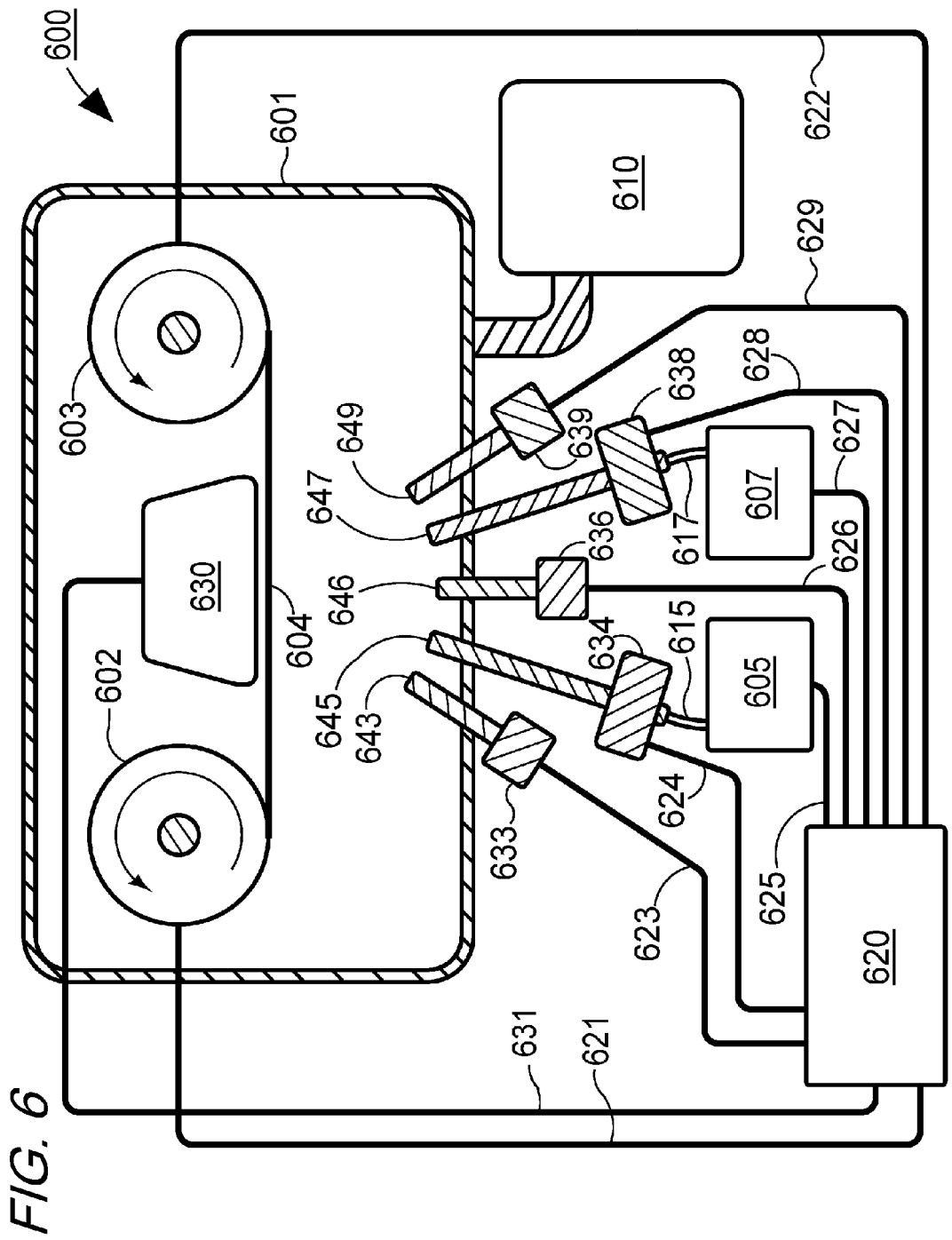
FIG. 6 illustrates a method for forming a superconductor composition.

Method Apparatus—FIG. 6

Owing to the layered structure, a method for making a composition of a layered ionic superconductor in a form of a film coating would be recognized as being advantageous to one practiced in the art. Methods for forming the coating comprise processes for including the species Na, Cs, Bi, F, and O.

An apparatus for forming a coating on a substrate is illustrated in FIG. 6. A fabrication tool 600 comprises a processing chamber 601 wherein a feed stock mechanism 602 supplies a conveyance comprising a work-piece substrate 604 and a product stock mechanism 603 receives the conveyance and the substrate.

The temperature of the region 604 is regulated by an adjacent heater 630 supplying heat by thermal radiation and conduction. Elemental sources 633, 634, 636, 638, and 639 provide species fluxes 643, 645, 646, 647, and 649, respectively, which in one aspect are sources of the atomic species Na, O, Cs, F, and Bi, respectively. Other atomic species can advantageously be substituted for Na in particular Hg and Cu. Other atomic species can advantageously be substituted for Bi in particular Pb, Tl, and Cu. Other atomic species can used to add cations to the layers comprising F, in particular a monovalent cation.

The sources 633, 636, and 639 are thermal effusion cells. The extracted fluxes 643, 646, and 649 comprise molecular or atomic beams of the species Na, Cs, and Bi, respectively.

The sources 634 and 638 comprise microwave plasma generators supplied by gas sources 605 and 607, respectively, by means of connecting tubes 615 and 617, respectively. Each of the generators comprises a gas-filled chamber inside a microwave cavity and an extraction port. The gas transport systems comprise materials resistant to chemical attack, particularly by gases comprising oxygen and fluorine, and include nickel and monel with fluoride coatings and parts or tubing comprising tetrafluoroethylene. The fluxes 645 and 647 are beams of O and F, respectively, and include a substantial fraction of free radical and neutral atomic forms O* and F*, respectively.

The fluxes impinging on substrate 604 are controlled by a programmed controller 620. The controller 620 is connected to the substrate mechanisms 602 and 603 by control lines 621 and 622, respectively, to the heater 630 by a control line 631, and to the sources and gas supplies by seven control lines 623 through 629.

A vacuum pump 610 regulates the pressure within the chamber 601.

Method of Operation

A film coating is formed on substrate 604 by reactive deposition of the constituent atomic species in a programmed sequence, thereby forming the individual layers of the composition. Table 2 provides an aspect for depositing a composition $Na_2Cs_2Bi_2F_3O_4$, including a listing and a description of 13 process steps, species generated, and numerals corresponding to species sources in FIG. 6. The process begins with a first step of depositing a monolayer of Bi followed by 12 additional steps, wherein the total number of 13 steps produces the 9 layers comprising one formula unit of the composition. Steps 7 though 12 form the 4 layers of the type 1 group. Steps 1 through 6 and step 13 form the 5 layers of the type 2 group. The sequence of 13 steps is repeated to form a film coating of selected thickness. Another predetermined step can be used as the first step with the remaining 12 steps following in the order provided by the programmed sequence, cycling back to step 1 after step 13.

The controller 620 causes the effusion cells to deposit predetermined doses of the programmed sequence of fluxes of Na, Cs, and Bi onto the work-piece substrate 604. The atomic species of O, F, O*, and F* extracted from the plasma excited by microwaves are highly reactive and convert the deposited Na, Cs, and Bi into ionic forms. The controller 620 includes monitoring systems and establishes a layer-by-layer growth of the constituent layers in the type 1 and type 2 groups of the composition. The sequence of deposition of the layers is repeated, forming a coating of a predetermined thickness on the substrate.

In a first aspect, the tool 600 forms a coating on an article comprising a superconducting material. The work-piece substrate 604 comprises one or more of a plurality of articles affixed to the conveyance. Articles with a prepared surface material are supplied as feed stock at mechanism 602 and the coated articles are collected as product stock at mechanism 603. Articles comprising circuits, including superconducting circuits, superconducting interconnects, optical components, and semiconductor components can also be used. Fabrication of the superconducting coating comprises one or more steps in a sequence of processes involving deposition of coatings including patterning by means of lithography and etching.

In a second aspect, the tool 600 forms a superconducting wire coating on the substrate. The wire produced in this manner can be bundled into cables for transmitting electrical power with a substantial reduction in wasted energy.

In a third aspect, articles to be coated are held within chamber 601 on a platen or chuck comprising a temperature control element. A programmed automated robot transports the articles, including loading one or more prepared articles onto the chuck, removing the articles after their being coated, and repeating the cycle in forming a plurality of coated articles.

Alternative Embodiments

A composition in a first alternative embodiment comprises one inner layer in the type 1 group. In one aspect of the type 1 group, a single inner layer comprises $Na^{+1}$ and $O^{-2}$ ions and two outer layers comprise $Cs^{+1}$ ions. In reference to FIG. 3, an aspect of the first alternative embodiment is derived by removing the inner layer 313 comprising the ions 327A and 327B. The single inner layer in the type 1 group provides a factor G of about ¾ or about one-half of the factor G provided by the two inner layers in the first and second embodiments. An aspect of the first alternative embodiment with 3 layers of $F^{-1}$ ions in the type 2 group and Bi ions in about a +4 oxidation state has a Tc of about 162 K.

Cations of other atomic species with a valence of about +1 may be used to form one or more inner layers comprising a type 1 group.

In a second alternative embodiment, the third species of ions in an inner layer of the type 1 group comprises $O^{-2}$ and an ion of an atomic species selected from the group consisting of Hg, Tl, and Cu.

In a third alternative embodiment, the fourth species of ions in an inner layer of the type 2 group comprises $O^{-2}$ and a multiple-valence ion of an atomic species selected from the group consisting of Cu and Pb.

In a fourth alternative embodiment, the number of layers of the second kind of ions in the type 2 group is a number N that is at least 4.

In a fifth alternative embodiment, the second species of ions in the type 2 group comprises $Li^{+1}$ and $F^{-1}$ ions. The fourth species of ions in the type 2 group comprises a multiple-valence cation, in particular a Cu ion having an average oxidation state between +2 and +3, and $O^{-2}$ ions. An additional positive charge provided by the $Li^{+1}$ ion is compensated by the selected multiple-valence cation.

A first aspect of a sixth alternative embodiment comprises O interstitials in the layers of the type 1 group. A negative ionic charge from the O interstitial provide a means for obtaining larger values for relative valence U, factor G, charge S, charge density, and Tc. In a second aspect, a portion of the O sites in the type 2 group are vacant. Changing the oxygen content with O interstitials in the type 1 group and O vacancies in the type 2 group provides a means for a beneficial increase in the charge S. Being a smaller ion than $Na^{+1}$, a $Li^{+1}$ ion in an inner layer of the type 1 group provides an extra amount of free volume to accommodate an extra $O^{-2}$ ion. A Cu ion or other species an oxidation state less than +3 accommodates an $O^{-2}$-ion vacancy in an inner layer of the type 2 group.

A first aspect of a seventh alternative embodiment comprises vacancies among the cations comprising the third species of ions in the inner layers of the type 1 group. A second aspect of a seventh alternative embodiment comprises vacancies among the cations comprising the fourth species of ions in the inner layers of the type 2 group. Reducing the proportion of cations in the inner layers provides a means for a beneficial increase in the charge S.

An eighth alternative embodiment comprises a combination of the first through seventh alternative embodiments including alternative multiple-valence ions.

A crystal of layered ionic superconductor has tetragonal lattice symmetry, although a crystal with an orthorhombic and a lower lattice symmetry is provided by some alternative embodiments.

A composition comprising defects in the crystal structure, including point defects, dislocations, stacking faults, and twin boundaries, is advantageous for obtaining a high superconducting critical current in the composition. The high critical current substantially improves the current carrying capacity of the composition.

Alternative embodiments include other methods of forming a layered ionic structure, including atomic layer deposition comprising a deposition of a single layer of a precursor molecule carrying an atomic species in the composition and a formation of a removable byproduct. Other methods include metal-organic chemical vapor deposition using a precursor molecule comprising one or more atomic species in the composition. Methods including sputtering by ion and electron beams, plasma processing, and laser ablation may also be used.

Other methods for forming a superconducting wire include cladding a composition comprising a layered ionic superconductor within a flexible and protective sheath, including copper or other materials.

Advantages

From the description above, a number of advantages of the several embodiments of a layered ionic superconductor become evident. In particular a composition comprising Na, Cs, Bi, F, and O provides several specific advantages:

(a) The composition provides a substantial increase in Tc relative to the highest Tc found in compositions of prior art.

(b) The composition provides a flow of a substantial superconducting current in a device or a system comprising the composition and operating at a temperature of about 195 K, 150 K, or at a lower temperature.

(c) Operating at a temperature of about 77 K, the composition provides substantially more superfluid density when compared to cuprates of prior art.

(d) The composition avoids some toxic materials including Hg and Tl found in some compositions of prior art.

(e) Increased Tc and superfluid density provide substantially improved energy efficiency in a superconductor technology comprising the composition.

(f) Layer-by-layer deposition provides a method for forming a layered ionic superconductor comprising the composition.

CONCLUSIONS, RAMIFICATIONS, AND SCOPE

Accordingly, it can be seen that the various embodiments for a composition of a layered ionic superconductor comprising $Cs^{+1}$ ions in a type 1 group and $F^{-1}$ ions in a type 2 group provides the following advantages. Among the atomic elements, Cs has the lowest electronegativity and F has the highest electronegativity. The large difference in the electronegativites of Cs and F is advantageous in a layered ionic superconductor, as illustrated in FIG. 1A. The composition provides a substantial improvement in superconductor properties, in particular by providing a high transition temperature and a large superfluid density.

An aspect of the first embodiment consists of 9 distinct layers, comprising the sequence of ions: (1) $Cs^{+1}$, (2) $Na^{+1}$ and $O^{-2}$, (3) $Na^{+1}$ and $O^{-2}$, (4) $Cs^{+1}$, (5) $F^{-1}$, (6) $Bi^{+3}$ and $O^{-2}$, (7) $F^{-1}$, (8) $Bi^{+3}$ and $O^{-2}$, and (9) $F^{-1}$. The sequence repeats according to additional layers in a composition comprising a predetermined number of layers more than 9. The 4 layers (1) through (4) comprise the type 1 group. The 5 layers (5) through (9) comprise the type 2 group, wherein a number N equal to 3 counts the layers (5), (7), and (9) comprising $F^{-1}$. The pair of layers (4) and (5) and the pair of layers (1) and (9) comprise the electronic interaction layers. Layers (4) and (1) are the first kind of electronic interaction layer comprising a plurality of the first type of electronic interaction charges. Layers (5) and (9) are the second kind of electronic interaction layer comprising a plurality of the second type of electronic interaction charges. The electronic interaction charges are separated by a mean intra-layer distance L of about 0.321 nm. A pair of electronic interaction layers are separated by a perpendicular distance Z of about 0.179 nm. The designed Tc of the composition is determined by C/LZ and is about 230 K. For operation at a temperature of about 195 K, the composition has a superfluid density of about 1.63 $nm^{-3}$.

An aspect of the second embodiment consists of 7 distinct layers, comprising the sequence of ions: (1) $Cs^{+1}$, (2) $Na^{+1}$ and $O^{-2}$, (3) $Na^{+1}$ and $O^{-2}$, (4) $Cs^{+1}$, (5) $F^{-1}$, (6) $Bi^{+3}$ and $O^{-2}$, and (7) $F^{-1}$. The 4 layers (1) through (4) comprise the type 1 group. The 3 layers (5) through (7) comprise the type 2 group. The number N is equal to 2 and counts the layers (5) and (7) comprising $F^{-1}$. The pairs of layers (4) and (5) and the pairs of layers (1) and (7) are the electronic interaction layers comprising the electronic interactions charges, wherein the distance L is about 0.2621 nm. The electronic interaction layers are separated by a perpendicular distance Z of about 0.179 nm. The Tc of the composition is C/LZ and about 188 K. For operation at a temperature of about 150 K, the composition has a superfluid density of about 2.57 $nm^{-3}$.

The compositions of the first, second, and other embodiments advantageously include crystalline defects for an improved critical current in the superconductor.

Compositions with values of L, Z, Tc, and superfluid density other than those provided in the above descriptions may be used. For example, a smaller portion of cations in the inner layers, relative to the portions of the cesium, oxygen and fluorine ions, may be used advantageously to provide an increase in an electronic interaction charge. In another example, a relatively larger portion of oxygen ions may be used for a similar advantage.

Ions of other atomic species may be substituted for those described in the above embodiments. Examples include a cation of a monovalent atomic species, particularly Li and Hg, being used in place of Na, and a cation of a multiple-valence atomic species, particularly Pb, Cu, and Tl, being used in place of Bi.

Certain ions substituted in an inner layer of a type 1 group advantageously increase the relative valence U. As a first example, using $N^{-3}$ for an anion in an inner layer of a type 1 group provides a larger difference between the charge states of a positive cation and the $N^{-3}$ anion. As a second example, replacing a cation with a nearly neutral rare gas atomic species, particularly xenon for which the atomic radius is close to the ionic radius $Na^{+1}$, provides a further means for increasing U. For each example, an increased U provides a composition with a higher Tc.

Methods of forming a composition of a layered ionic superconductor comprise layer-by-layer growth, including atomic and molecular deposition of the individual species of cations and anions. Methods of maintaining the operating temperature of a device and a system comprising the composition include thermoelectric coolers, Carnot cycle refrigerators, high-emissivity heat radiation panels, solar energy panels, and other energy conversion systems.

A ramification of a layered ionic superconductor includes an application that becomes favorable or possible, owing to a substantial improvement in superconducting properties. In particular, a lower amount of energy is consumed while maintaining a superconductor composition at a selected temperature of operation. Examples include power generation and transmission, transportation, and information storage, transmission and utilization, wherein:

(1) In generation of electrical power, an electrical generator comprising a coil of wire incorporating the superconducting composition in its windings has an improved efficiency of current generation relative to conventional copper wire. When compared to copper wire operated at about room temperature, the superconducting wire reduces wasted energy by at least 50%. Superconducting wire provides as much as a one-hundred-fold increase in the current density, improves efficiency, and reduces a generator's size and weight.

(2) A superconducting high tension wire decreases the amount of energy that is lost in the transmission of electrical power, advantageously increasing the amount of deliverable power.

(3) In a navigational instrument, a superconducting composition enables frictionless stabilizing gyroscopes utilizing a superconducting levitation technology.

(4) In a satellite technology, utilization of the superconducting composition in the electronics reduces heat load, thereby advantageously reduces the running temperature of the satellite.

(5) In a seismology application, a measurement of rotational motion generated via seismic activity is accomplished by levitating a test mass above a superconductor composition utilizing flux pinning. Advantages are reduced parasitic resonances and extrinsic noise.

(6) Applied to medical magnetic resonance imaging systems, a superconducting composition in the wires of a magnet provides an improvement in efficiency and a lower cost of operation.

(7) Applied to Josephson junction technology, a composition with improved superconducting properties provides for an increased processing speed of computers, in particular greater than a thousand-trillion floating-point calculations per second. Improved superconducting properties also enables oscillators providing efficient emission of radiation for terahertz imaging and communication.

(8) Magnetic levitation utilizing magnets wound with wire comprising the superconductor composition is feasible for reduced cost of running trains at speeds of over 300 miles per hour.

(9) A large electromagnet comprising the superconducting composition is able to store a substantial amount of energy. In a high power pulsed application, the energy is delivered to an electrical load element in a circuit in a relatively short burst.

(10) Maintaining a large amount of data accumulated by society worldwide in an electronic form consumes a vast amount of energy. The superconducting composition can be utilized to reduce power consumption by the electronics.

(11) Considerable energy is consumed in delivering large amounts of data, including by wireless telecommunications. A superconducting composition is feasible for reducing the power consumption of cellular communications stations. An improved superconducting composition with a transition temperature above room temperature would reduce energy waste in personal hand-held devices, including cellular telephones and portable and notepad computers, thereby improving battery life time and reducing the energy cost of recharging batteries.

Although the above description of a layered ionic superconductor contains many specificities, these should not be construed as limiting the scope of the embodiments, but as merely providing illustrations of some of several embodiments.

Many alterations and modifications may be made without departing from the scope presented herein by those having ordinary skill in the art. For example, the atomic species comprising the electronic interaction layers may be attached to a substrate material, including graphene comprising one or more sheets of carbon atoms, and layers comprising boron or other atoms. The electronic interaction charges may be produced by an electrostatic method, analogous to charging a capacitor comprising an anode electrode and a cathode electrode. The electronic interaction charges may also be produced by charge transfer from physically adsorbed and chemically adsorbed atomic and molecular species. Examples include a substrate material with adsorbates comprising interacting and charging elements.

Other examples include a superconductor composition comprising sulphur including an organic compound and including a charge transfer salt. An example is kappa-di[bis-ethylenedithiotetrathiafulvalene] copper dicyanamide bromide or κ-[BEDT-TTF]$_2$Cu[N(CN)$_2$]Br, comprising a type 1 group consisting of κ-[BEDT-TTF]$_2$ and a type 2 group consisting of Cu[N(CN)$_2$]Br, and having Tc of about 10 K. A distance Z of 0.2458 nm separates the electronic interaction layers. A charge fraction from datum 102 and a factor G having a value of ⅛ determines a distance L of 4.372 nm between the electronic interaction charges. With modified molecular layering and charge structure, an increased charge fraction and a factor G closer to unity are feasible. Accordingly, the value of L is increased and the value of C/LZ determines a higher value for Tc.

The scope includes layers of ions or species lying on a curved surface including a closed surface in a three-dimensional space. Two or more adjacent curved surfaces can be used. Examples of a curved surface are the surface of a carbon fullerene molecule, a carbon nano-tube, and a bent sheet comprising graphene. Also included are embodiments wherein a first distance between a first species comprising a first interaction layer is unequal to a second distance between a second species comprising a second interaction layer.

In aspects of the first and second embodiments, a charge of about −1 provided by Na$^{+1}$ and O$^{-2}$ balances a charge of about +1 on Cs$^{+1}$. The scope for a layered ionic superconductor includes a composition comprising a cation and an anion in oxidation states of opposite sign such that their charges sum to nearly zero. Examples include a cation in a +1 charge state paired with F$^{-1}$, a cation in a +2 charge state paired with O$^{-2}$, and a cation in a +3 charge state paired with N$^{-3}$. A composition comprising a species from group IV of the periodic table of elements is also feasible, for example using carbon.

The claims are to be understood to include what is specifically illustrated and described above in this specification, what is conceptually equivalent, what can be substituted, and what incorporates the ideas of the specification. Thus the scope of the embodiments should be determined by the appended claims and their legal equivalents, rather than by the examples given.

TABLE 1

Compositions, Transition Temperatures, and Design Parameters.

| | SUPERCONDUCTOR | Tc (K) | Z (nm) | L (nm) |
|---|---|---|---|---|
| Cs—F | Na$_2$Cs$_2$Bi$_2$F$_3$O$_{4+d}$ | 230 | 0.179 | 0.393 |
| | Na$_2$Cs$_2$BiF$_2$O$_{3+d}$ | 188 | 0.179 | 0.321 |
| COPPER | HgBa$_2$Ca$_2$Cu$_3$O$_{8+d}$ (pressure) | 145 | 0.1933 | 0.4466 |
| | HgBa$_2$Ca$_2$Cu$_3$O$_{8+d}$ | 135 | 0.1996 | 0.4653 |
| | TlBa$_2$Ca$_2$Cu$_3$O$_{9+d}$ | 133.5 | 0.2032 | 0.4647 |

TABLE 1-continued

Compositions, Transition Temperatures, and Design Parameters.

|  | SUPERCONDUCTOR | Tc (K) | Z (nm) | L (nm) |
|---|---|---|---|---|
|  | $Tl_2Ba_2Ca_2Cu_3O_{10}$ | 130 | 0.2056 | 0.4655 |
|  | $HgBa_2CaCu_2O_{6.22}$ | 127 | 0.2039 | 0.4862 |
|  | $(Bi,Pb)_2Sr_2Ca_2Cu_3O_{10+d}$ | 112 | 0.1687 | 0.6541 |
|  | $Tl_2Ba_2CaCu_2O_8$ | 110 | 0.2014 | 0.5709 |
|  | $YBa_2Cu_4O_8$ (pressure) | 104 | 0.2166 | 0.5582 |
|  | $TlBa_2CaCu_2O_{7-d}$ | 103 | 0.2082 | 0.5711 |
|  | $LaBa_2Cu_3O_{7-d}$ | 97 | 0.2195 | 0.5798 |
|  | $HgBa_2CuO_{4.15}$ | 95 | 0.1921 | 0.7045 |
|  | $YBa_2Cu_3O_{6.92}$ | 93.7 | 0.2268 | 0.5709 |
|  | $Bi_2Sr_2CaCu_2O_{8+d}$ | 89 | 0.1795 | 0.8020 |
|  | $(Ca_{0.45}La_{0.55})(Ba_{1.30}La_{0.70})Cu_3O_{7.15}$ | 80.5 | 0.2130 | 0.7118 |
|  | $Tl_2Ba_2CuO_6$ | 80 | 0.1929 | 0.8097 |
|  | $Pb_2Sr_2(Y,Ca)Cu_3O_8$ | 75 | 0.2028 | 0.8015 |
|  | $(Pb_{0.5}Cu_{0.5})Sr_2(Y,Ca)Cu_2O_{7-d}$ | 67 | 0.1997 | 0.9233 |
|  | $YBa_2Cu_3O_{6.60}$ | 63 | 0.2232 | 0.8627 |
|  | $La_{1.8}Sr_{0.2}CaCu_2O_{6\pm\delta}$ | 58 | 0.1783 | 1.1990 |
|  | $RuSr_2GdCu_2O_8$ | 50 | 0.2182 | 1.1370 |
|  | $(Sr_{0.9}La_{0.1})CuO_2$ | 43 | 0.1705 | 1.7667 |
|  | $TlBa_{1.2}La_{0.8}CuO_5$ | 39 | 0.1867 | 1.7193 |
|  | $La_{1.837}Sr_{0.163}CuO_{4-d}$ | 38 | 0.1783 | 1.8673 |
|  | $Tl_{0.7}(Sr,La)CuO_5$ | 37 | 0.1837 | 1.7958 |
|  | $Ba_2YRu_{0.9}Cu_{0.1}O_6$ | 35 | 0.2081 | 1.8612 |
|  | $Bi_2(Sr_{1.6}La_{0.4})CuO_{6+d}$ | 34 | 0.1488 | 2.4080 |
| IRON | $Sm(O_{0.65-y}F_{0.35})FeAs$ | 55 | 0.1597 | 3.0447 |
|  | $(Sm_{0.7}Th_{0.3})OFeAs$ | 51.5 | 0.1667 | 1.3290 |
|  | $Tb(O_{0.80-y}F_{0.20})FeAs$ | 45 | 0.1671 | 1.4371 |
|  | $(Ba_{0.6}K_{0.4})Fe_2As_2$ | 37 | 0.1582 | 1.7262 |
|  | $FeSe_{0.977}$ (pressure) | 36.5 | 0.1932 | 1.7482 |
|  | $Ce(O_{0.84-y}F_{0.16})FeAs$ | 35 | 0.1424 | 2.3883 |
|  | $Rb_{0.83}Fe_{1.70}Se_2$ | 31.5 | 0.1682 | 1.9924 |
|  | $K_{0.83}Fe_{1.66}Se_2$ | 29.5 | 0.2146 | 1.8289 |
|  | $Cs_{0.83}Fe_{1.71}Se_2$ | 28.5 | 0.2024 | 2.0492 |
|  | $La(O_{0.92-y}F_{0.08})FeAs$ | 26 | 0.2330 | 1.8187 |
|  | $Fe_{1.03}Se_{0.57}Te_{0.43}$ (pressure) | 23.3 | 0.1768 | 2.8427 |
|  | $Ba(Fe_{1.84}Co_{0.16})As_2$ | 22 | 0.1892 | 2.8004 |

TABLE 2

Process Module for Forming Na—Cs—Bi—F—O Composition.

|  | Process Step | Material | Source |
|---|---|---|---|
| 1 | Bismuth layer deposition | Bi | 639 |
| 2 | Oxidation of bismuth layer | O* | 634 |
| 3 | Fluoridation over bismuth oxide | F* | 638 |
| 4 | Bismuth layer deposition | Bi | 639 |
| 5 | Oxidation of bismuth layer | O* | 634 |
| 6 | Fluoridation over bismuth oxide | F* | 638 |
| 7 | Cesium layer deposition over fluoridation | Cs | 636 |
| 8 | Sodium layer deposition over cesium | Na | 633 |
| 9 | Oxidation of sodium layer | O* | 634 |
| 10 | Sodium layer deposition over sodium oxide | Na | 633 |
| 11 | Oxidation of sodium layer | O* | 634 |
| 12 | Cesium layer deposition over sodium oxide | Cs | 636 |
| 13 | Fluoridation over cesium layer | F* | 638 |

What is claimed is:

1. A composition of matter for a layered ionic superconductor comprising a plurality of layers of atomic elements and comprising:
   a) a first kind of layer comprising a plurality of ions of the atomic element cesium;
   b) a second kind of layer comprising a plurality of ions of the atomic element fluorine;
   c) a third kind of layer comprising a plurality of ions of the atomic elements sodium and oxygen; and
   d) a fourth kind of layer comprising a plurality of ions of the atomic elements bismuth and oxygen; wherein:
the first kind of layer being adjacent to the second kind of layer and adjacent to the third kind of layer, the second kind of layer being adjacent to the fourth kind of layer, and the composition of matter having about 2 parts sodium, about 2 parts cesium, about 1 part bismuth, about 2 parts fluorine, and about 3 parts oxygen,
whereby the composition provides a superconductor having a substantially improved superconducting transition temperature.

2. The composition of matter of claim 1 further having about 1 part bismuth, about 1 part fluorine, and about 1 part oxygen, and comprising sodium, cesium, bismuth, fluorine, and oxygen in relative proportions of about 2, 2, 2, 3, and 4, respectively.

3. A method for fabricating a composition matter for a layered ionic superconductor comprising a means for providing a sequential deposition of a plurality of atomic species on a substrate, wherein the atomic species comprise the atomic elements cesium and fluorine, and wherein a superconductor coating is formed on the substrate and the coating has a substantially improved superconducting transition temperature.

4. The method of claim 3 further including atomic species selected from the group consisting of sodium, mercury, and copper.

5. The method of claim 3 further including atomic species selected from the group consisting of bismuth, copper, and thallium.

6. The method of claim 3 further including atomic species comprising oxygen.

7. A composition of matter for a layered ionic superconductor comprising a plurality of layers of atomic elements and comprising:

a) a first kind of layer comprising a plurality of ions of the atomic element cesium;
b) a second kind of layer comprising a plurality of ions of the atomic element fluorine;
c) a third kind of layer comprising a plurality of ions of the atomic elements mercury and oxygen; and
d) a fourth kind of layer comprising a plurality of ions of the atomic elements copper and oxygen; wherein:

the first kind of layer being adjacent to the second kind of layer and adjacent to the third kind of layer, the second kind of layer being adjacent to the fourth kind of layer, and the composition of matter having about 2 parts mercury, about 2 parts cesium, about 1 part copper, about 2 parts fluorine, and about 3 parts oxygen, whereby the composition provides a superconductor having a substantially improved superconducting transition temperature.

8. The composition of matter of claim 7 further having about 1 part copper, about 1 part fluorine, and about 1 part oxygen, and comprising mercury, cesium, copper, fluorine, and oxygen in relative proportions of about 2, 2, 2, 3, and 4, respectively.

\* \* \* \* \*